United States Patent
Bulumulla et al.

(10) Patent No.: US 10,712,499 B2
(45) Date of Patent: Jul. 14, 2020

(54) SEMICONDUCTOR DEVICES AND METHODS OF FORMING SAME

(71) Applicant: GLOBALFOUNDRIES INC., Grand Cayman (KY)

(72) Inventors: Selaka Bandara Bulumulla, Niskayuna, NY (US); Md Sayed Kaysar Bin Rahim, Malta, NY (US); Tanya Andreeva Atanasova, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/202,037

(22) Filed: Nov. 27, 2018

(65) Prior Publication Data

US 2020/0166704 A1 May 28, 2020

(51) Int. Cl.
| | | |
|---|---|---|
| *G02B 6/12* | (2006.01) | |
| *H01L 23/00* | (2006.01) | |
| *G02B 6/122* | (2006.01) | |
| *H01L 23/522* | (2006.01) | |
| *H01L 23/64* | (2006.01) | |
| *H01L 49/02* | (2006.01) | |
| *G02B 6/13* | (2006.01) | |

(52) U.S. Cl.
CPC .......... *G02B 6/1225* (2013.01); *G02B 6/13* (2013.01); *H01L 23/5226* (2013.01); *H01L 23/5227* (2013.01); *H01L 23/645* (2013.01); *H01L 24/09* (2013.01); *H01L 24/17* (2013.01); *H01L 24/48* (2013.01); *H01L 24/73* (2013.01); *H01L 28/10* (2013.01); *G02B 2006/1213* (2013.01); *G02B 2006/12061* (2013.01); *G02B 2006/12166* (2013.01); *H01L 2224/0231* (2013.01); *H01L 2224/02373* (2013.01); *H01L 2924/1206* (2013.01); *H01L 2924/1425* (2013.01)

(58) Field of Classification Search
CPC .................................. G02B 6/12; H01L 23/00
USPC .......................................................... 385/14
See application file for complete search history.

(56) References Cited

U.S. PATENT DOCUMENTS

| | | | |
|---|---|---|---|
| 6,690,845 B1 * | 2/2004 | Yoshimura | G02B 6/12002 257/E23.01 |
| 10,326,423 B1 * | 6/2019 | Bartell | H03H 7/38 |
| 2011/0217045 A1 * | 9/2011 | Watson | G02B 6/12002 398/79 |
| 2013/0120059 A1 | 5/2013 | Oku | |
| 2013/0314707 A1 * | 11/2013 | Shastri | G01B 11/14 356/399 |
| 2015/0076661 A1 * | 3/2015 | Musk | H01L 23/4985 257/615 |
| 2017/0031115 A1 | 2/2017 | Schaevitz et al. | |
| 2017/0194310 A1 * | 7/2017 | Evans | G02B 6/12004 |

* cited by examiner

*Primary Examiner* — Kaveh C Kianni
(74) *Attorney, Agent, or Firm* — David Cain

(57) ABSTRACT

The present disclosure relates to packaging of integrated circuit chips for semiconductor devices. More particularly, the present disclosure relates to packaging of multiple chips for silicon photonics devices. The present disclosure provides a semiconductor device including a photonic integrated circuit (PIC) chip, an inductor positioned over the PIC chip, and a transimpedance amplifier (TIA) chip positioned over the PIC chip. The inductor has a first terminal end and a second terminal end, and the first terminal end is connected to the PIC chip.

19 Claims, 16 Drawing Sheets

SEMICONDUCTOR DEVICES AND METHODS OF FORMING SAME

FIELD OF THE INVENTION

The present disclosure generally relates to packaging of integrated circuit chips for semiconductor devices. More particularly, the present disclosure relates to packaging of multiple chips for silicon photonics devices.

BACKGROUND

In the optoelectronics industry, silicon photonics and photonics modules are key enabling technologies and platforms for potentially revolutionary advances in the optical communication systems, data communications, security, and sensing. Silicon photonics has the potential to realize small, highly integrated, photonics sub-systems that take advantage of integrated circuit (IC) fabrication technology and scalability to achieve the full potential of these platforms. Further, multi-chip integration of silicon photonics allows for the bridging of different functional technologies, such as micro-electro-mechanical systems (MEMS), III-V materials, non-complimentary metal-oxide semiconductor (CMOS) application-specific integrated circuits (ASIC), etc.

A typical silicon photonics package using multi-chip integration may include a photonic integrated circuit (PIC) chip attached with optical fibers and a trans-impedance amplifier (TIA) chip that are interconnected with conducting wires (e.g., wire bonds). Ideally, a constant bandwidth is desirable in transmission/reception of signals in the silicon photonic package. Additionally, it is also desirable to increase and maximize the overall bandwidth of the silicon photonics package.

One possible approach to achieving increased and stabilized bandwidth value is to predetermine an inductance value in the conducting wires between the PIC chip and the TIA chip, which is dependent on the resulting wire length used for wire bonding. However, due to demands for reduced physical sizes and increased density of elements in semiconductor packaging, as well as process variations in the packaging process, the resulting interconnecting wires used in the silicon photonic package may have varying lengths and loop height leading to variable bandwidth values, higher parasitic inductance and poorer device performance. Furthermore, the dimensional variability of interconnecting wires due to process variations may limit the potential to increase the overall bandwidth of the package.

Therefore, it is desirable to achieve an optimized semiconductor packaging of silicon photonics whereby the bandwidth is stable and maximised, and yet able to deliver smaller packaging footprints with improved device performance.

SUMMARY

In one aspect of the present disclosure, there is provided a semiconductor device, including a photonic integrated circuit (PIC) chip, an inductor positioned over the PIC chip, and a transimpedance amplifier (TIA) chip positioned over the PIC chip. The inductor has a first terminal end and a second terminal end, and the first terminal end is connected to the PIC chip. The TIA chip has an input contact and an output contact, and the input contact of the TIA chip is connected to the second terminal end of the inductor and the output contact of the TIA chip being distal from the inductor.

In another aspect of the present disclosure, there is provided a semiconductor device, including a PIC chip, a multilayer dielectric body disposed on the PIC chip, one or more pairs of inductors positioned within the multilayer dielectric body, each inductor having a first and second terminal ends and the first terminal end is connected to the PIC chip, and a TIA chip positioned over the PIC chip. The TIA chip having one or more pairs of input contacts positioned at an input side and one or more pairs of output contacts positioned at an output side, with each output contact of the TIA chip being connected to a conductive trace positioned within the multilayer dielectric body. The input side of the TIA chip is positioned over the second terminal ends of the inductors with the input contacts connected thereto and the output side of the TIA chip being distal from the inductors. The silicon photonics device also includes a plurality of ground vias positioned within the multilayer dielectric body and connected to the PIC chip, the ground vias are spaced apart from one another and aligned to form a fence-like structure. The TIA chip is positioned over the plurality of ground vias.

Another aspect of the present disclosure provides a method of forming a semiconductor device, including providing a PIC chip, forming an inductor over the PIC chip, the inductor having first and second terminal ends, and the first terminal end is connected to the PIC chip. The method also includes providing a TIA chip having an input contact and an output contact, positioning the TIA chip to have the input contact over and connecting with the second terminal end of the inductor, and to have the output side of the TIA chip distal from the inductor.

Advantageously, by interconnecting the TIA chip and the PIC chip using an inductor and positioning the input side of the TIA chip over the terminal ends of the inductor is found to minimize dimensional variability of the interconnection between the chips, thereby improving the control and increase the consistency of the predetermined inductance value between the chips. By improving the control of inductance value, the overall bandwidth of the semiconductor device can be stabilized and maximized. More advantageously, by positioning the output contact of the TIA chip to be distal from the inductor, the inductor can avoid picking up an output signals from the TIA chip, thereby reducing the likelihood of creating an unwanted feedback loop between the output of the TIA chip and the inductor, which may render the device non-functional. Further advantageously, the positioning of the inductor within a multilayer dielectric body on the PIC chip is found to enable smaller and higher density packaging of semiconductor components in the device and at the same time, achieving the desired bandwidth requirements of the device and improving the device performance.

BRIEF DESCRIPTION OF THE DRAWINGS

The present disclosure may be understood by reference to the following description taking in conjunction with the accompanying drawings.

Figure 1A:
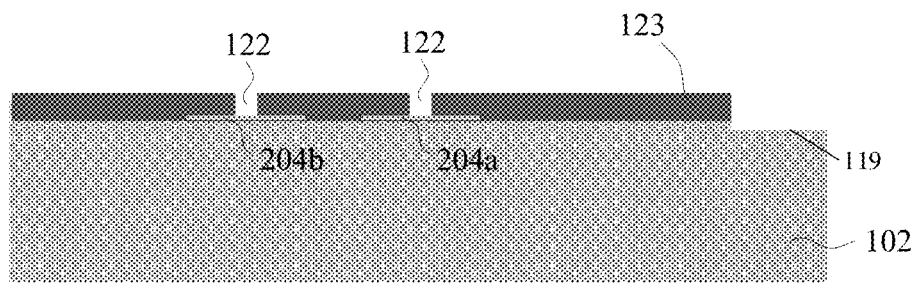
FIG. 1A depicts a cross section view of an exemplary PIC chip in accordance with embodiments of the present disclosure.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Referring to FIG. 1A, a PIC chip 102 is depicted. The PIC chip 102 may be fabricated by known semiconductor processes. The PIC chip 102 includes a photodiode, as well as other devices (not shown). A first and second via pads 204a and 204b and a dielectric layer 123 are deposited on the PIC chip 102. The first via pad 204a is connected to the photodiode in the PIC chip and the second via pad 204b is connected to a ground layer in the PIC chip (not shown). In some embodiments (not shown), there are a plurality of second via pads 204b connected to the ground layer in the PIC chip. The via pads 204a and 204b may be formed by any suitable deposition methods. Via pad openings 122 are formed on the dielectric layer 123 to expose the via pads 204a and 204b. In one embodiment, the via pads 204a and 204b are aluminum pads. In another embodiment, the dielectric layer 123 is a polyimide. The PIC chip 102 also includes V-grooves 119 patterned on the PIC chip 102. The V-grooves 119 may be patterned by a conventional semiconductor patterning process.

Figure 1B:
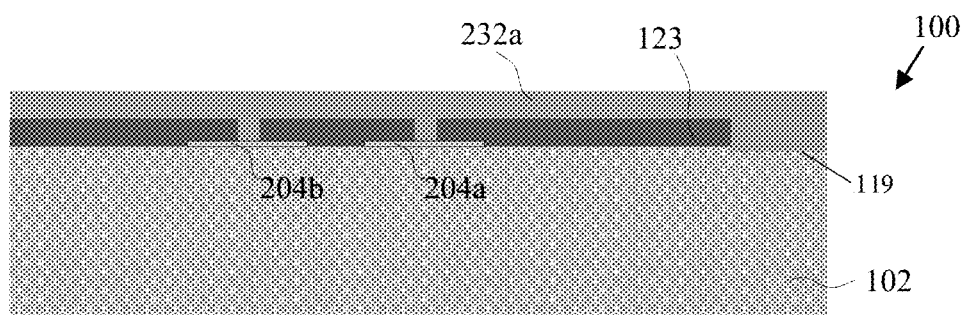
FIGS. 1B to 1O are schematic cross section views of a partially processed semiconductor device at successive stages of forming a semiconductor device in accordance with embodiments of the present disclosure.

Referring to FIG. 1B, a partially processed semiconductor device 100 is shown. A first insulating layer 232a is formed on the dielectric layer 123. The first insulating layer 232a may be formed using conventional deposition techniques, such as chemical vapor deposition (CVD), physical vapor deposition (PVD), or spin-coating. In one embodiment, the first insulating layer 232a is formed by spin-coating a polyimide layer on the dielectric layer 123. The first insulating layer 232a covers the V-grooves 119 and the via pads 204a and 204b, as shown in FIG. 1B.

Figure 1C:
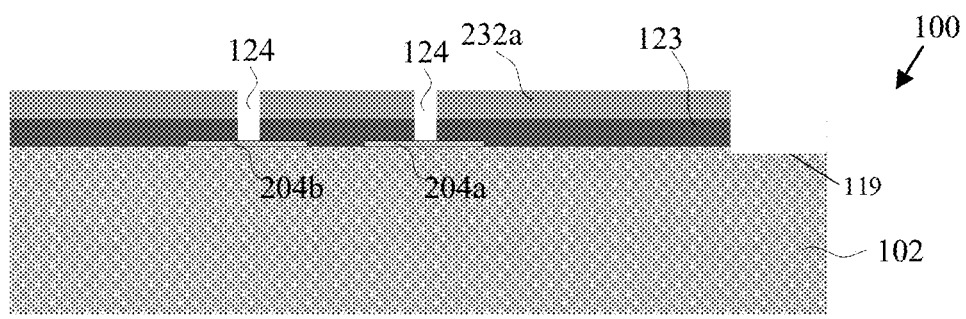
FIGS. 1P and 1P' show cross section views of connections between the TIA chip and a partially processed semiconductor device at successive stages of forming a semiconductor device in accordance with embodiments of the present disclosure.
FIG. 1Q is a schematic diagram depicting cross section views of attaching a partially processed semiconductor device to a laminate substrate at successive stages of forming a semiconductor device in accordance with embodiments of the present disclosure.

Referring to FIG. 1C, a partially processed semiconductor device 100 after patterning the first insulating layer 232a is shown. Openings 124 are formed in the first insulating layer 232a to expose the via pads 204a and 204b and the V-grooves 119. The openings 124 may be formed by performing any suitable patterning techniques, such as wet etch lithographic processes, dry etch lithographic processes or direct patterning processes. In one embodiment, the first insulation layer 232a is first subjected to a soft baking process. The soft baking process is performed in the temperature range of about 100 to 120° C. Next, the first insulating layer 232a is exposed to a light source (e.g., ultraviolet light) through a patterned mask (not shown) placed above the first insulating layer 232a. The patterned mask includes patterns for revealing the V-grooves 119 of the PIC chip and patterns for patterning the first insulating layer 232a. The first insulating layer 232a is then developed with an alkaline solution (e.g., tetramethyl ammonium hydroxide (TAMH)) to reveal the via pads 204a and 204b and the V-grooves 119 of the PIC chip, followed by curing at a temperature range of about 280 to 350° C. A cleaning process is subsequently performed using oxygen plasma to remove residual insulating materials on the revealed via pads 204a and 204b and the V-grooves 119 of the PIC chip.

Figure 1D:
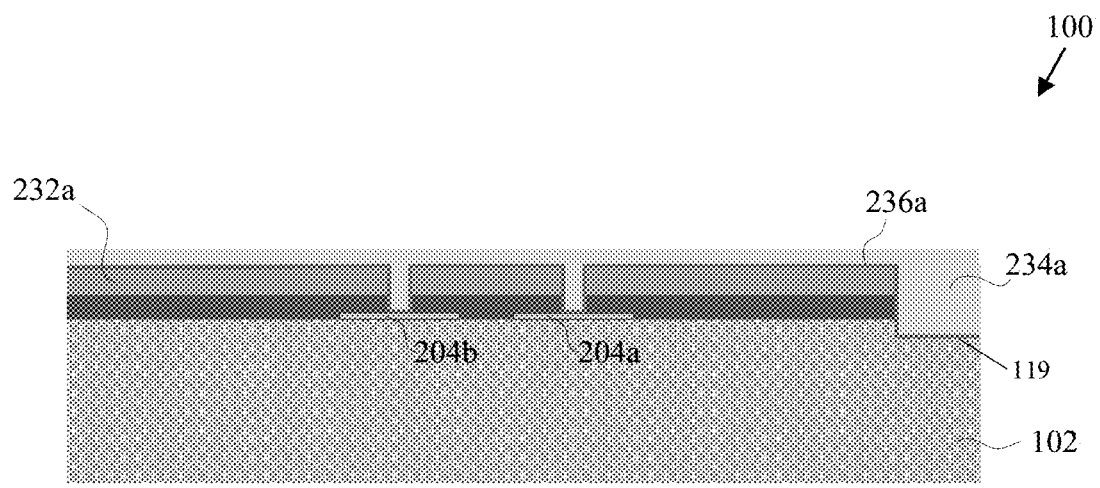

Referring to FIG. 1D, a partially processed semiconductor device 100 after applying a first seed layer 236a and forming a first photoresist layer 234a on the patterned first insulating layer 232a is shown. The formation of the first seed layer 236a and the first photoresist layer 234a may be performed using any suitable deposition techniques, such as PVD, sputtering, or spin-coating. In one embodiment, the first seed layer 236a is deposited by sputtering either a copper-titanium nitride (TiN—Cu) or tantalum nitride (TaN) seed layer on the surface of the first insulating layer 232a. The deposited first seed layer 236a conforms to the topography of the patterned first insulating layer 232a and the V-grooves 119 and covers the via pads 204a and 204b, as shown in FIG. 1D. Next, the first photoresist layer 234a is deposited on the first seed layer 236a by spin-coating. A soft baking process is then performed on the deposited photoresist layer 234a. In another embodiment, the soft baking process is preferably performed in the temperature range of about 100 to 120° C.

Figure 1E:
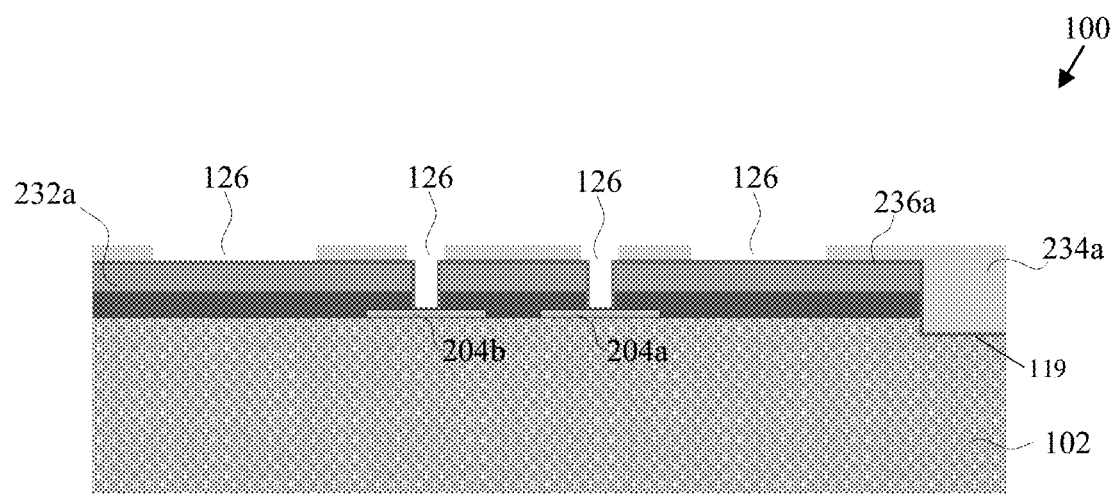

Referring to FIG. 1E, a partially processed semiconductor device 100 with the patterned first photoresist layer 234a is shown. A pattern is defined on the first photoresist layer 234a by forming photoresist openings 126 on the first photoresist layer 234a. The formation of the photoresist openings 126 may be performed by any suitable patterning techniques, such as wet etch lithographic processes, dry etch lithographic processes or direct patterning processes. In one embodiment, the first photoresist layer 234a is exposed to a light source (e.g., ultraviolet light) through a patterned mask (not shown) to define patterns on the first photoresist layer 234a for subsequent development with a developing solution. The exposed photoresist layer 234a is then developed with an organic developing solution to form the photoresist openings 126, followed by curing the patterned first photoresist layer 234a at a temperature range of about 200 to 250° C.

Figure 1F:
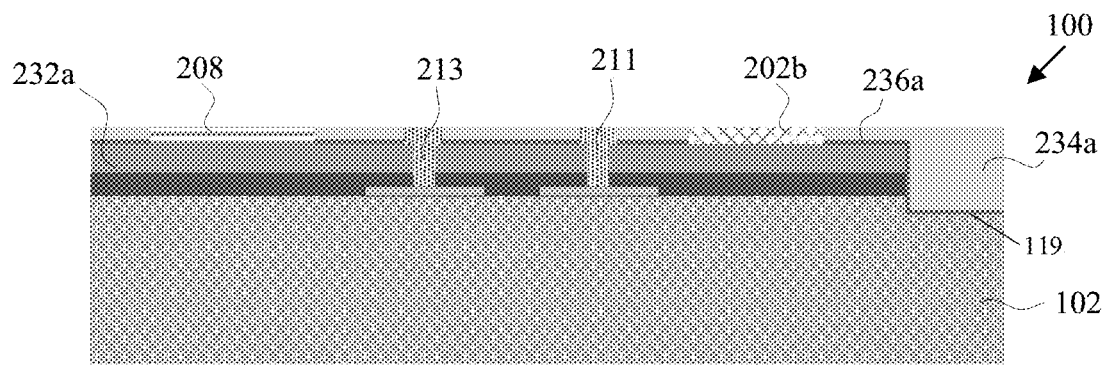

Referring to FIG. 1F, a partially processed semiconductor device 100 after forming a first redistribution pattern on the patterned photoresist layer is shown. Formation of the first redistribution pattern includes filling the previously formed photoresist openings with conductive materials to obtain a desired redistribution network of interconnect vias and conductive layers. The conductive materials are deposited by performing an electroplating step to promote adhesion of the conductive materials to the first seed layer 236a. In one embodiment, the formation of the first redistribution pattern includes filling the previously formed photoresist openings to form a conductive trace 208, a partial ground via 213, a partial inductor via 211, and a crossing layer 202b of an inductor, as shown in FIG. 1F. In some embodiments described herein, one or more conductive traces are formed. In various embodiments, the conductive materials used in the electroplating step may include copper or cobalt. In one embodiment, the conductive material is preferably copper.

Figure 1G:
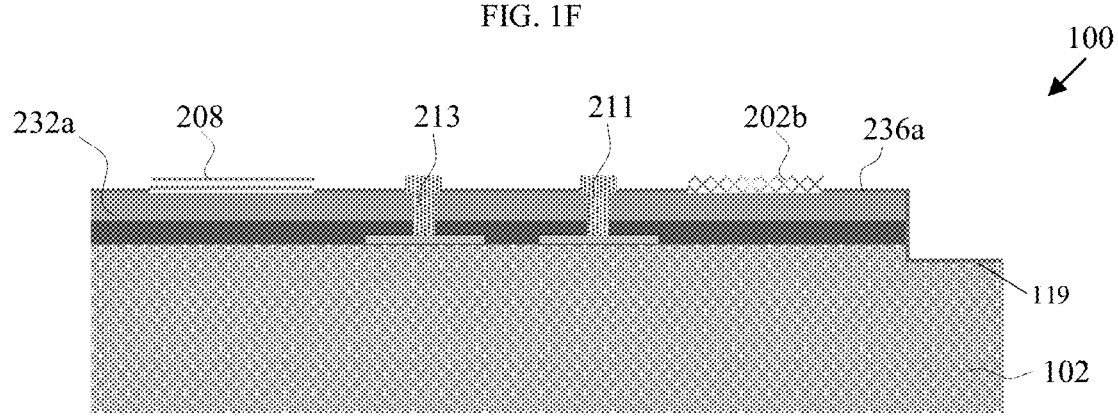

Referring to FIG. 1G, a partially processed semiconductor device 100 after removing the first photoresist layer is shown. The removal of the first photoresist layer may be performed by any suitable photoresist stripping process. The removal of the first photoresist layer reveals portions of the first seed layer 236a and exposes the conductive trace 208, the partial ground via 213, the partial inductor via 211 and crossing layer 202b, as shown in FIG. 1G.

Figure 1H:
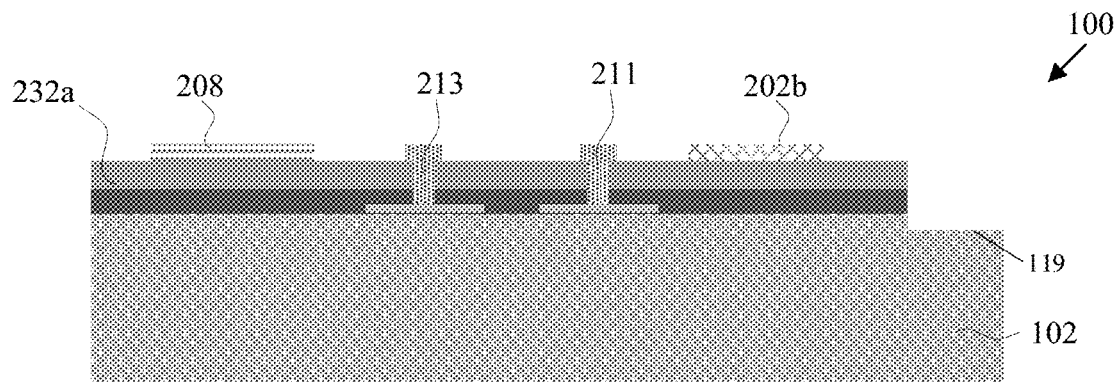

Referring to FIG. 1H, the partially processed semiconductor device 100 after removing the previously revealed first seed layer is shown. The removal of the first seed layer is performed by an etching process. As shown in FIG. 1H, the removal of the first seed layer reveals the V-groove 119 and portions of the first insulating layer 232a.

Figure 1I:
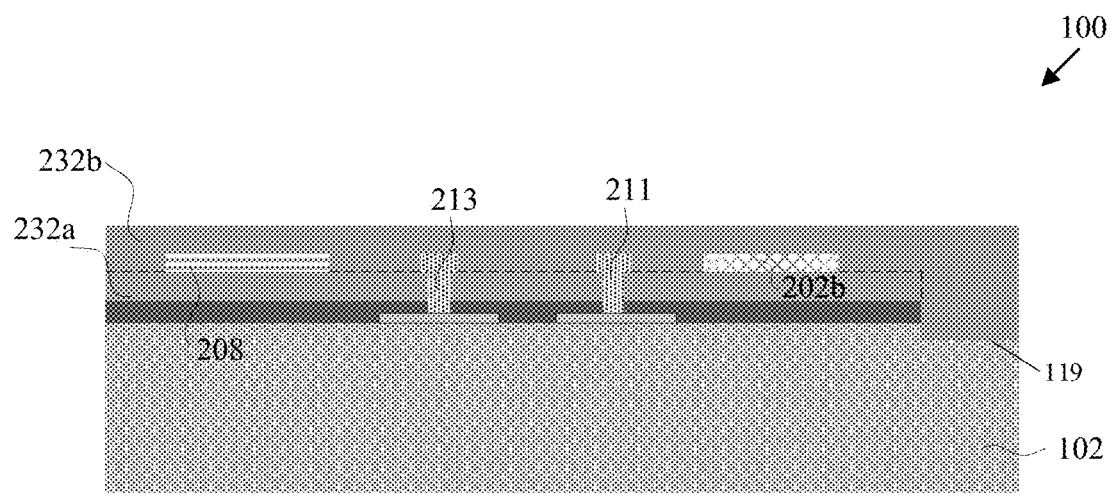

Referring to FIG. 1I, a partially processed semiconductor device 100 after forming a second insulating layer 232b is shown. The second insulating layer 232b is formed over the first insulating 232a, the V-groove 119, the conductive trace 208, the partial ground via 213, the partial inductor via 211 and crossing layer 202b, as shown in FIG. 1I. The interface between the first insulating layer 232a and the second insulating layer 232b is indicated by a dotted line. The second insulating layer 232b may be formed using the same deposition techniques used to form first insulating layer 232a. In one embodiment, the second insulating layer 232b is formed by spin-coating a polyimide layer on the topography of the partially processed semiconductor device 100. The coated second insulating layer 232b covers the first insulating layer 232a, the V-groove 119, the conductive trace 208, the partial ground via 213, the partial inductor via 211 and the crossing layer 202b, as shown in FIG. 1I.

Figure 1J:
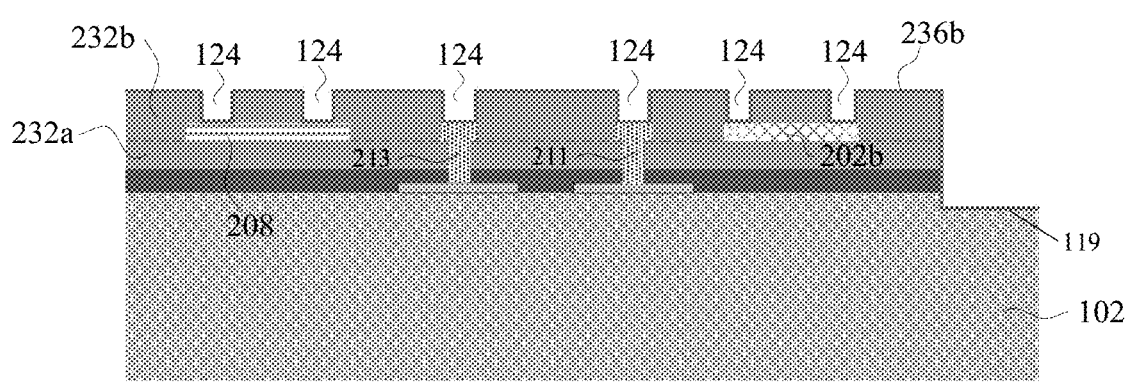

Referring to FIG. 1J, a partially processed semiconductor device 100 after patterning the second insulating layer 232b and applying a second seed layer 236b on the second insulating layer 232b is shown. Patterning of the second insulating layer 232b may be performed using the same patterning steps and process parameters used to pattern the first insulating layer 232a. In one embodiment, the second insulating layer 232b is patterned by forming openings 124 to reveal portions of the conductive trace 208, the partial ground via 213, the partial inductor via 211, the crossing layer 202b and the V-grooves 119 of the PIC chip 102.

Next, the second seed layer 236b is applied. Application of the second seed layer 236b may be performed using the same deposition techniques used to apply the first seed layer. In another embodiment, the second seed layer is deposited by sputtering either a Ti—Cu or TaN seed layer on the surface of the second insulating layer 232b. As shown in FIG. 1D, the deposited second seed layer 236b conforms to the topography of the patterned second insulating layer 232b and covers the previously revealed portions of the conductive trace 208, the partial ground via 213, the partial inductor via 211, the crossing layer 202b and the V-grooves 119 of the PIC chip 102.

Figure 1K:
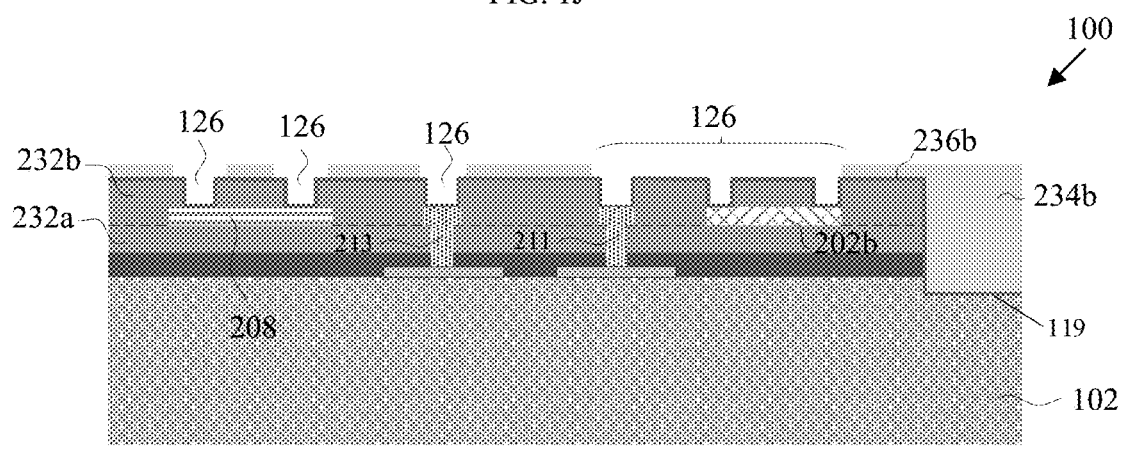

Referring to FIG. 1K, a partially processed semiconductor device 100 after forming and patterning a second photoresist layer 234b is shown. The second photoresist layer 234b may be formed by using the same deposition techniques and process parameters used to form the first photoresist layer. In one embodiment, the second photoresist layer 234b is initially deposited on the second seed layer 236b by spin-coating. The deposition of the second photoresist layer 234b fills the previously formed openings in the second insulating layer 232b.

Next, a pattern is defined on the deposited second photoresist layer 234b by forming photoresist openings 126 on the second photoresist layer 234b. The formation of the photoresist openings 126 may be performed by applying the same patterning techniques used to pattern the first photoresist layer. In another embodiment, the second photoresist layer 234b is exposed to a light source through a patterned mask (not shown) to define patterns on the second photoresist layer 234b. The pattern formed on the second photoresist layer may be different from the pattern formed on the first photoresist layer. The exposed second photoresist layer 234b is then developed with an organic solution to form the photoresist openings 126, followed by curing of the second photoresist layer 234b.

Figure 1L:
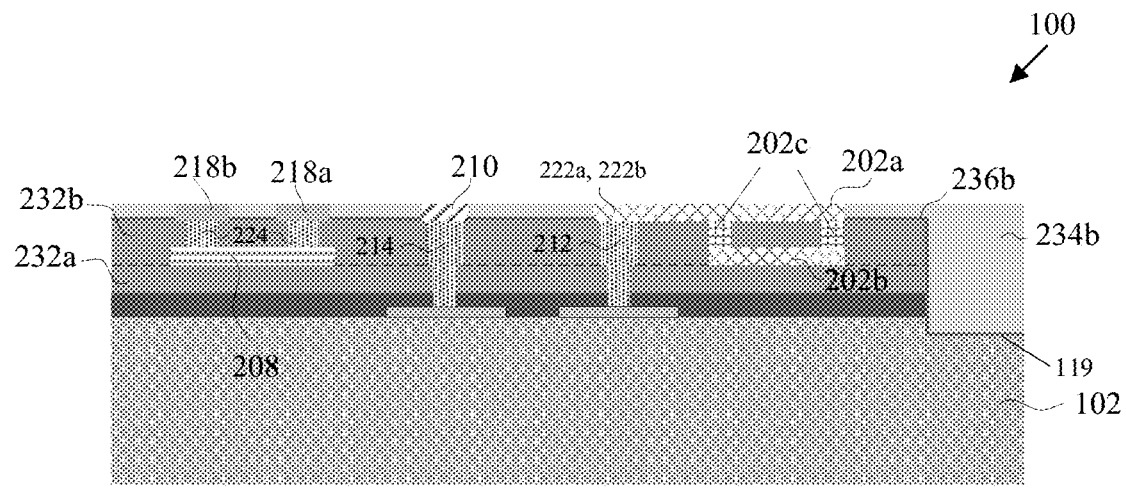

Referring to FIG. 1L, a partially processed semiconductor device 100 after forming a second redistribution pattern in the patterned second photoresist layer is shown. Formation of the second redistribution pattern includes filling the previously formed photoresist openings with conductive materials to obtain a desired redistribution network of interconnect vias and conductive layers. The formed second redistribution pattern is interconnected with the first redistribution pattern. The conductive materials are deposited by performing an electroplating step to promote adhesion of the conductive materials to the second seed layer 236b. In one embodiment, the formation of the second redistribution pattern includes forming conductive connectors 218a and 218b, a ground contact pad 210, a turning layer 202a, inductor interconnect vias 202c, a ground via 214, an inductor via 212. The turning layer 202a, the inductor interconnect vias 202c and the crossing layer 202b constitute an inductor. In some embodiments described herein, one or more inductors are formed by the method described herein, each having the same turning layer 202, inductor interconnect vias 202c and the crossing layer 202b.

The conductive connectors may be a TIA conductive connector 218a and a laminate conductive connector 218b. As shown in FIG. 1L, the conductive connectors 218a and 218b interconnect the conductive trace 208 with interconnect vias 224. The ground contact pad 210 interconnects the first via pad 204a with the ground via 214. The turning layer 202a of the inductor interconnects the second via pad 204b with the inductor via 212. The turning layer 202a of the inductor includes a first and second terminal ends 222a and 222b, respectively). The first terminal end 222a joins the inductor via 212.

Figure 1M:
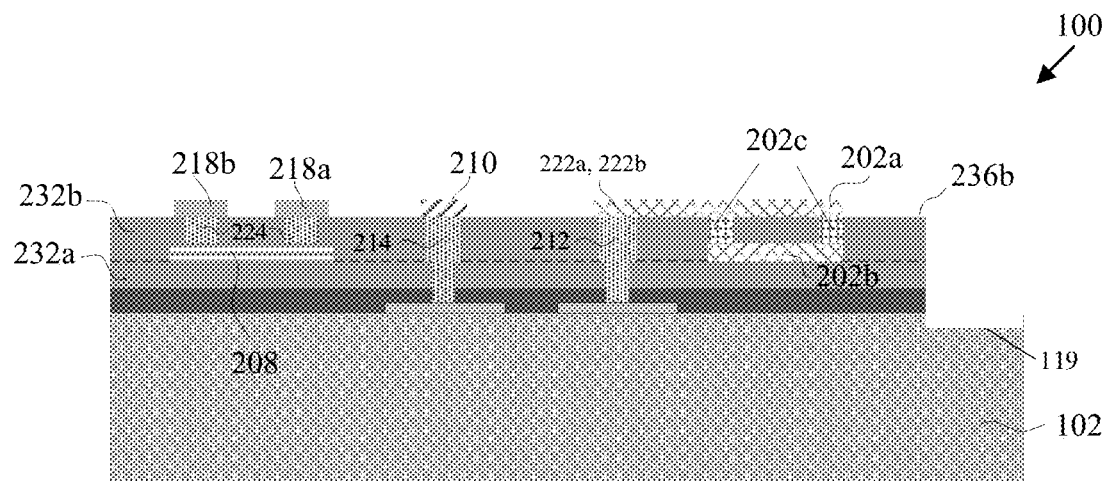

Referring to FIG. 1M, a partially processed semiconductor device 100 after removing the second photoresist layer and the second seed layer is shown. The removal of the second photoresist layer may be performed by any suitable photoresist stripping process. The removal of the second seed layer is performed by an etching process. As shown in FIG. 1M, the removal of the seed layer reveals the V-groove 119 and portions of the second insulating layer 232b.

Figure 1N:
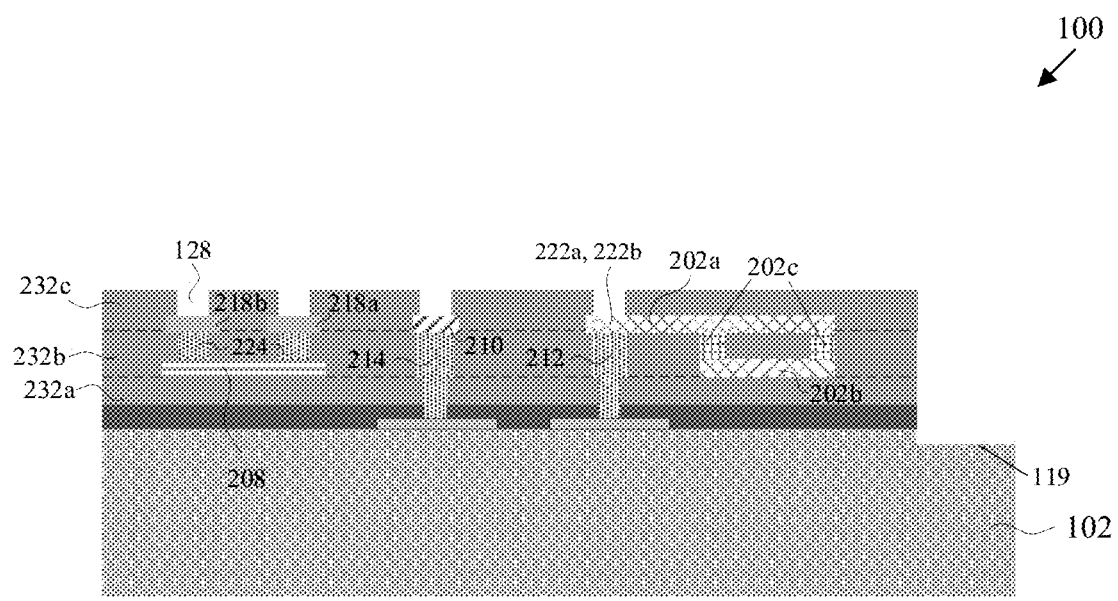

Referring to FIG. 1N, a partially processed semiconductor device 100 after formation of a third insulating layer 232c with contact openings 128 is shown. The third insulating layer 232c is initially formed over conductive connectors 218a and 218b, the ground contact pad 210, the turning layer 202a and the second insulating layer 232b, followed by patterning the third insulating layer 232c to form contact openings 128, as shown in FIG. 1N. The formation of the third insulating layer 232c may be performed using the same deposition techniques used to form first insulating layer 232a. In one embodiment, the third insulating layer 232c is formed by spin-coating a polyimide layer on the topography of the partially processed semiconductor device 100. The interface between the third insulating layer 232c and the second insulating layer 232b is indicated by a dotted line.

Patterning of the third insulating layer 232c may be performed using the same patterning steps and process parameters used to pattern the first insulating layer 232a. In one embodiment, the third insulating layer 232b is patterned by forming contact openings 128 to expose the conductive connectors 218a and 218b, the ground contact pad 210, a second terminal end of the inductor 222b and the V-grooves 119.

Figure 1O:
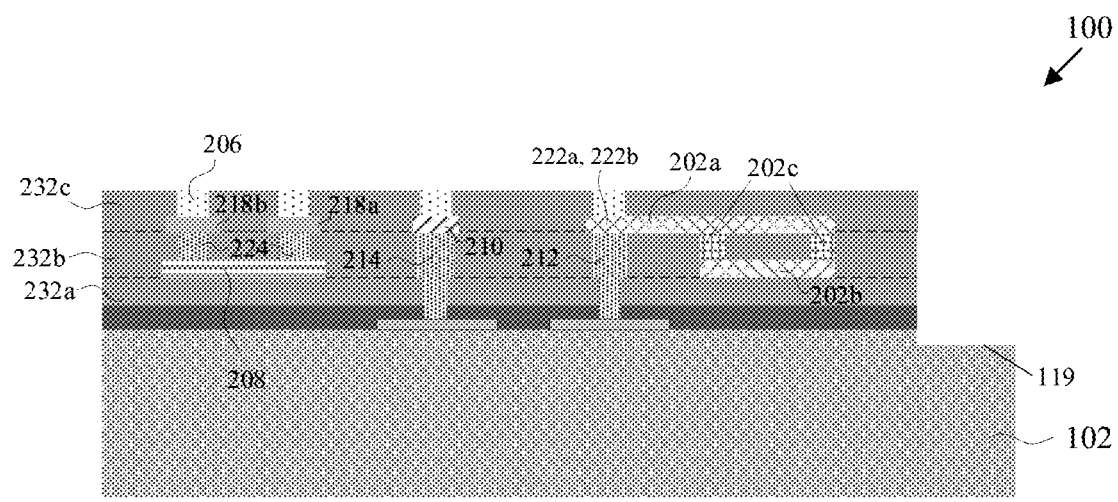

Referring to FIG. 1O, a partially processed semiconductor device 100 with under bump layers 206 is shown. The under bump layers 206 are disposed on the exposed conductive connectors 218a and 218b, ground contact pad 210 and the second terminal end of the inductor 222b. In one embodiment, the under bump layers 206 is formed by performing an electroless nickel immersion gold (ENIG) plating on the exposed surfaces of the conductive connectors 218a and 218b, the ground contact pad 210 and a second terminal end of the inductor 222b. A cleaning process may be performed on the exposed surfaces using oxygen plasma before plating of the under bump layers 206.

Figure 1P:
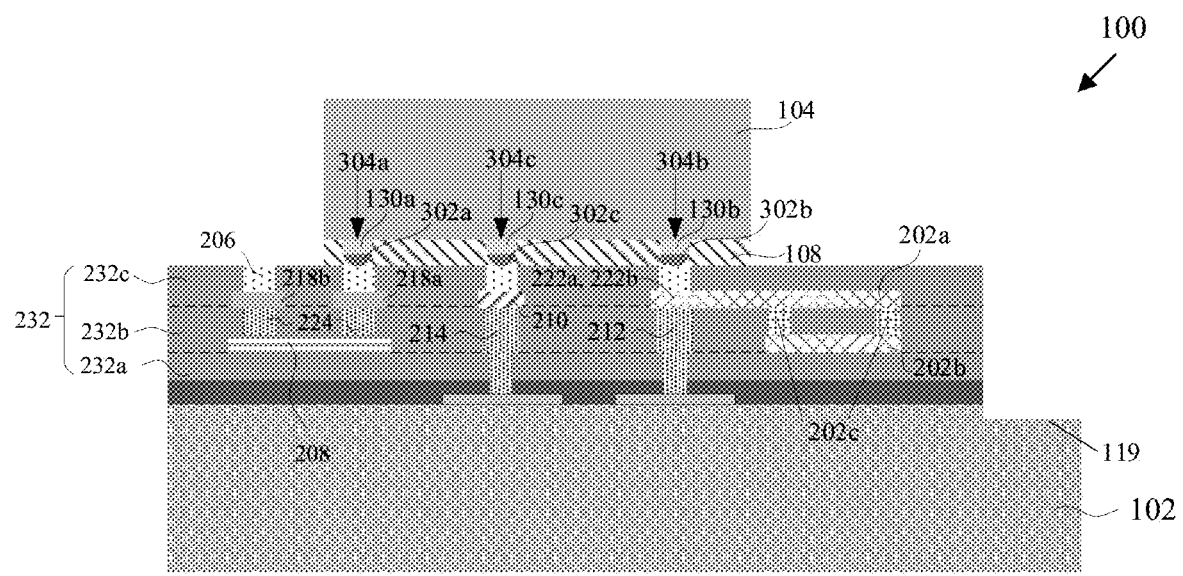
Figure 1P:
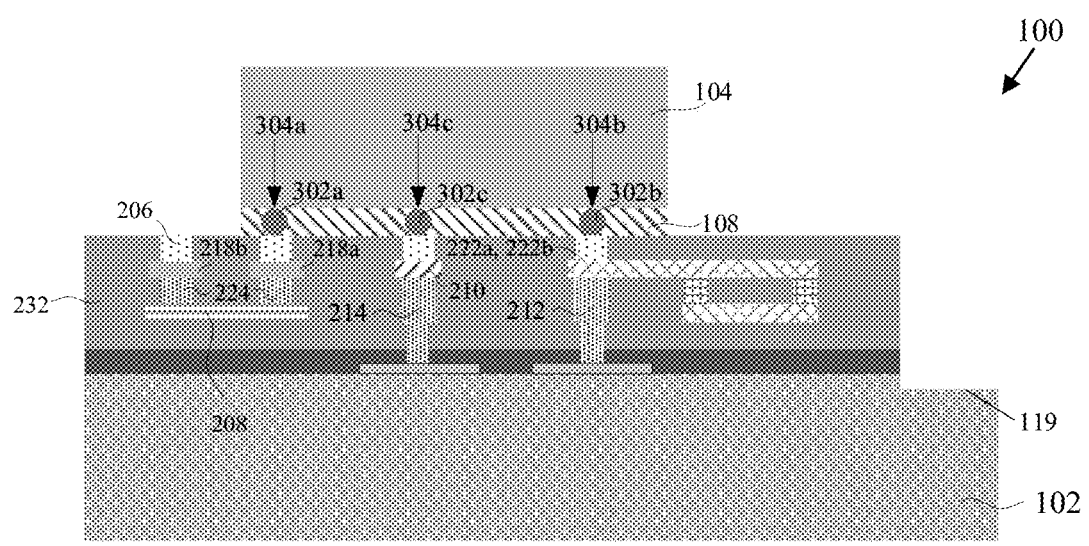

As shown in FIGS. 1P and 1P', the first, second and third insulating layers 232a, 232b and 232c constitute a plurality of insulating layers 232. Referring to FIG. 1P, a partially processed semiconductor device 100 having a TIA chip 104 electrically connected to the under bump layers 206 is shown. The TIA chip 104 may be formed using any suitable semiconductor manufacturing process. The TIA chip 104 includes an input contact 304b positioned at an input side, an output contact 304a positioned at an output side and a ground contact 304c. In some embodiments described herein, the TIA chip includes at least one input contact positioned at an input side, at least one output contact positioned at an output side, and one or more ground contacts. The ground contact 304c of the TIA chip 104 is positioned between and spaced apart from the input contact 304b and the output contact 304a of the TIA chip 104. In one embodiment, the ground contact 304c is positioned at a midpoint between the input contact 304b and the output contact 304a.

Conductive pillars 130a, 130b and 130c and conductive bumps 302a, 302b and 302c are disposed on the input contact 304b, the output contact 304a and the ground contact 304c. The conductive bumps 302a, 302b and 302c may be a solder bump. In another embodiment, the conductive bumps 302a, 302b and 302c has a preferred diameter of about 80 μm. In various embodiments, the conductive materials used in the conductive bumps 302a, 302b and 302c and the conductive pillars 130a, 130b and 130c may include copper or tin-silver-copper alloy (SAC alloy). In another embodiment, the conductive pillars 130a, 130b and 130c are preferably copper pillars and the conductive bumps 302a, 302b and 302c are preferably SAC alloy.

The TIA chip 104 is positioned over the TIA conductive connector 218a, the ground contact pad 210 and the second terminal end of the inductor 222b. The positioning of the TIA chip 104 includes positioning the TIA chip 104 to have the input contact 304b of the TIA chip 104 over the second terminal end of the inductor 222b and the output side of the TIA chip distal from the inductor. In one embodiment, the TIA chip 104 is bonded to the under bump layers 206 by a flip chip bonding process. For example, the TIA chip 104 is mounted onto the under bump layers 206 by having the conductive bumps 302 contact the under bump layers 206 previously formed on the exposed surfaces of the conductive connectors 218a and 218b, the ground contact pad 210 and a second terminal end of the inductor 222b. The conductive bumps 302a, 302b and 302c are then reflowed to complete the bonding. In another embodiment, the reflowing of the conductive bumps is performed by an annealing process. An under fill material 108 is subsequently inserted between the TIA chip 104 and the under bump layers 206 by capillary under-filling. The under fill material 108 surrounds the conductive pillars 130 and the conductive bumps 302a, 302b and 302c and functions as an insulator to prevent shorting across the conductive pillars 130a, 130b and 130c and the conductive bumps 302a, 302b and 302c.

An alternative embodiment of the electrical connection between the TIA chip 104 and the under bump layers 206 is shown in FIG. 1P'. In the alternative embodiment, only conductive bumps 302a, 302b and 302c are disposed on the input contact 304b, the output contact 304a and the ground contact 304c of the TIA chip. The TIA chip is flip chip bonded to the under bump layer 206 using the same techniques as described above.

Figure 1Q:
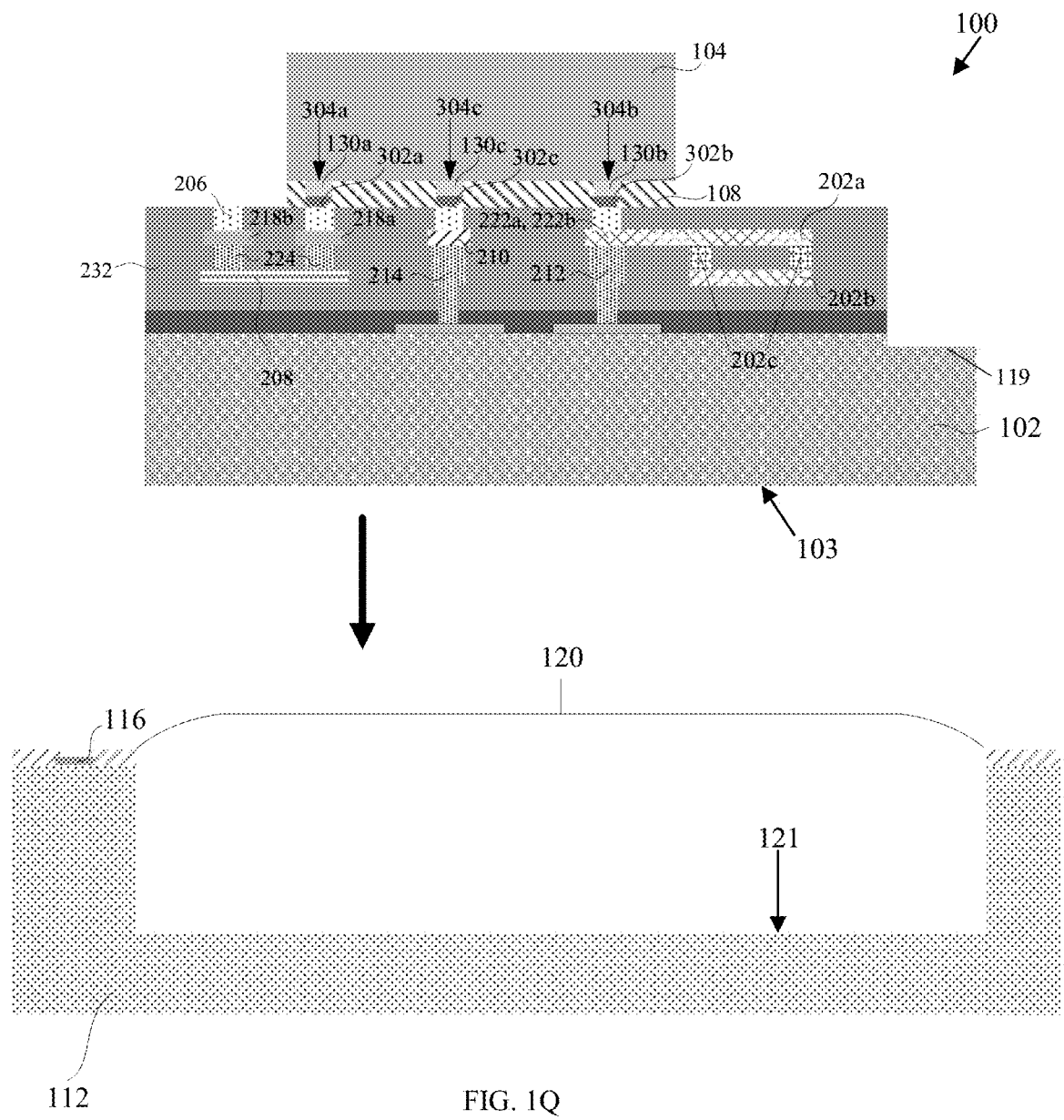

Referring to FIG. 1Q, a schematic diagram depicting the attachment of a partially processed semiconductor device 100 with a laminate substrate 112 is shown. The laminate substrate 112 includes a laminate cavity 120. A bottom surface of the PIC chip 103 is positioned over the laminate cavity 120 and brought into contact with the cavity surface of the laminate 121. In an alternative embodiment (not shown), a die attachment material may be disposed on the cavity surface of the laminate prior to contacting the PIC chip bottom surface.

Figure 2:
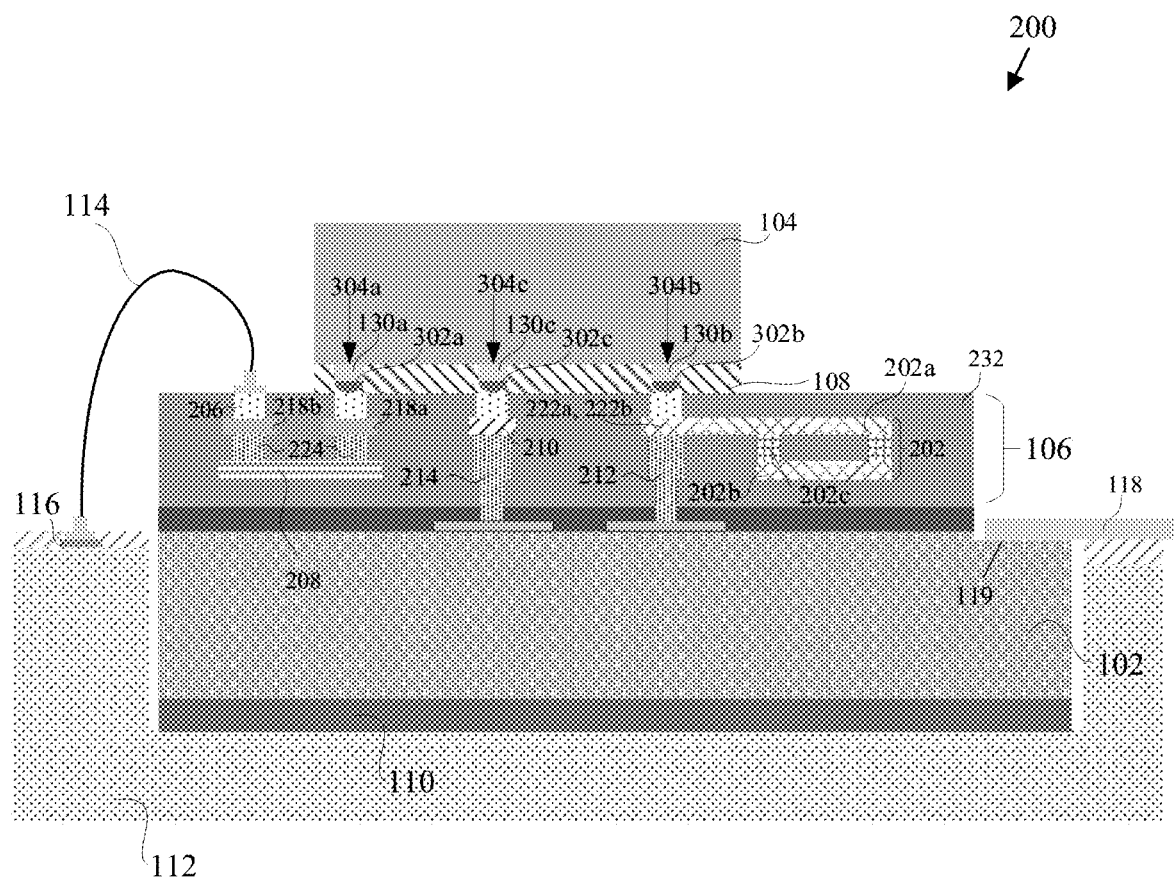
FIG. 2 shows a cross-sectional view of an example of a semiconductor device in accordance with embodiments of the present disclosure.

Referring to FIG. 2, an embodiment of the semiconductor device 200 in accordance with the present disclosure is shown. The semiconductor device 200 includes the TIA chip 104, the PIC chip 102 attached to the laminate substrate 112 by a die attachment material 110, and a multilayer dielectric body 106 disposed on the PIC chip 102. In one embodiment, the die attachment material 110 is an epoxy material. As shown in FIG. 2, the laminate body 112 includes a laminate contact 116. The laminate contact 116 connects to the laminate conductive connector 218b of the multilayer dielectric body 106 by forming a wire bond 114. In some embodiments, a single or a plurality of fibers 118 are attached to the V-grooves 119 and supported on the laminate substrate 112.

The multilayer dielectric body 106 includes redistribution patterns embedded in the insulating layers. As described herein, the redistribution patterns in the insulating layers are created by patterning each insulating layer of the multilayer dielectric body to form openings in the insulating layer, and filling the openings with conductive materials. As shown in FIG. 2, the multilayer dielectric body 106 includes an inductor positioned within a plurality of insulating layers 232. As described herein, at least one inductor is positioned over the PIC chip 102. The inductor is electrically connected to the PIC chip 102 through the inductor via 212 and the first via pad 204a. The inductor is also electrically connected to the input contact 304b of the TIA chip 104 through the under bump layer 206, the conductive bump 302 and the conductive pillar 130. The inductor has a body 202 that includes the turning layer 202a and the crossing layer 202b. The turning layer 202a and the crossing layer 202b are positioned in different layers of the multilayer dielectric body 106, as shown in FIG. 2. The turning layer 202*a* is interconnected to the crossing layer 202*b* with inductor interconnect vias 202*c*. In one embodiment, the thickness of the turning layer and the crossing layer is preferably about 6 µm. In another embodiment, an insulating layer having a preferred thickness of about 10 µm is positioned in between the turning layer and the crossing layer.

The multilayer dielectric body 106 further includes the conductive trace 208 interconnected with conductive connectors 218*a* and 218*b* by interconnect vias 224. As shown in FIG. 2, the output contact 304*a* of the TIA chip 104 is electrically connected to the conductive trace 208. As described herein, the output side of the TIA chip 104 is configured to be distal from the inductor body 202. In one embodiment, only the input side of the TIA chip is positioned over the first and second terminal ends of the inductor.

The multilayer dielectric body 106 further includes the ground contact pad 210 and the ground via 214. In some embodiments, the multilayer dielectric body 106 includes a plurality of ground vias and ground contact pads. The ground via 214 is spaced apart from and positioned between the input contact 304*b* and the output contact 304*a* of the TIA chip 104. The TIA chip 104 is grounded to the PIC chip 102 by electrically connecting the ground contact 304*c* of the TIA chip 104 to the ground contact pad 210 with the conductive pillar 130 and the conductive bump 302. The ground via 214 extends through the multilayer dielectric body 106 and connects the ground contact pad 210 to the second via pad 204*b* of the PIC chip 102.

In one embodiment, the redistribution patterns embedded in the multilayer dielectric body 106 includes the conductive trace 208, interconnect vias 224, conductive connectors 218*a* and 218*b*, the ground via 214, the ground contact pad 210, the inductor via 212 and the inductor. The multilayer dielectric body 106 may function as a redistribution layer by routing electrical signals to various areas of the semiconductor device, including active and passive circuits of the chips and providing electrical interconnect options during integration of the chips.

Referring to FIGS. 3A-3E, top-down views of a portion of the semiconductor device according to embodiments of the present disclosure are shown. For clarity's sake, the TIA chip 104 is outlined by a rectangle in FIGS. 3A-3E so as not to obscure the illustration of the ground vias 214 positioned underneath the TIA chip.

Figure 3A:
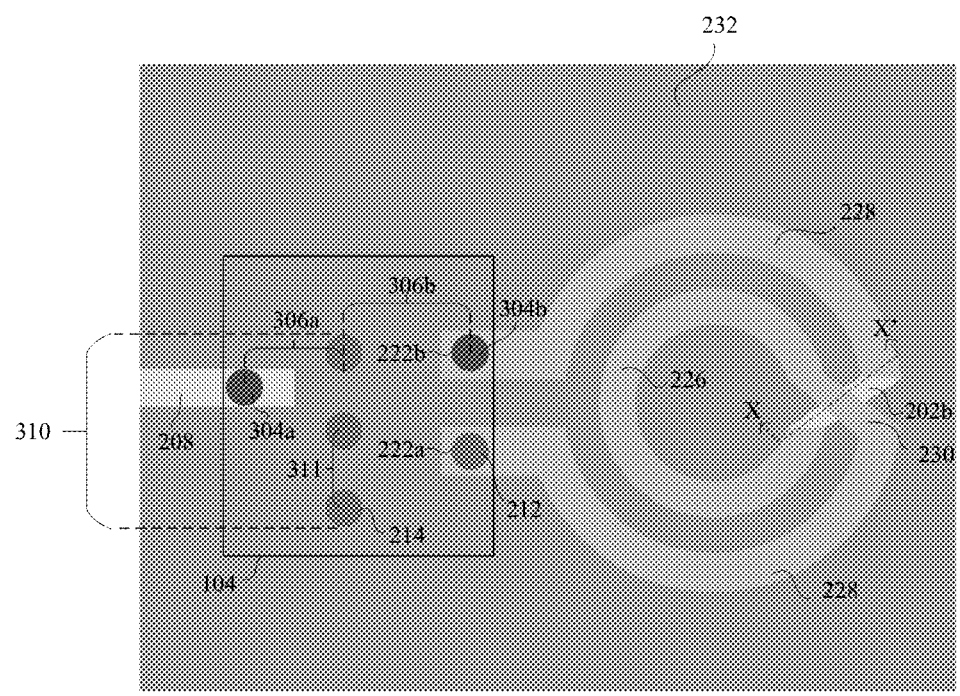
FIGS. 3A-3E show top-down views of a portion of the semiconductor device in accordance with embodiments of the present disclosure.
Figure 3B:
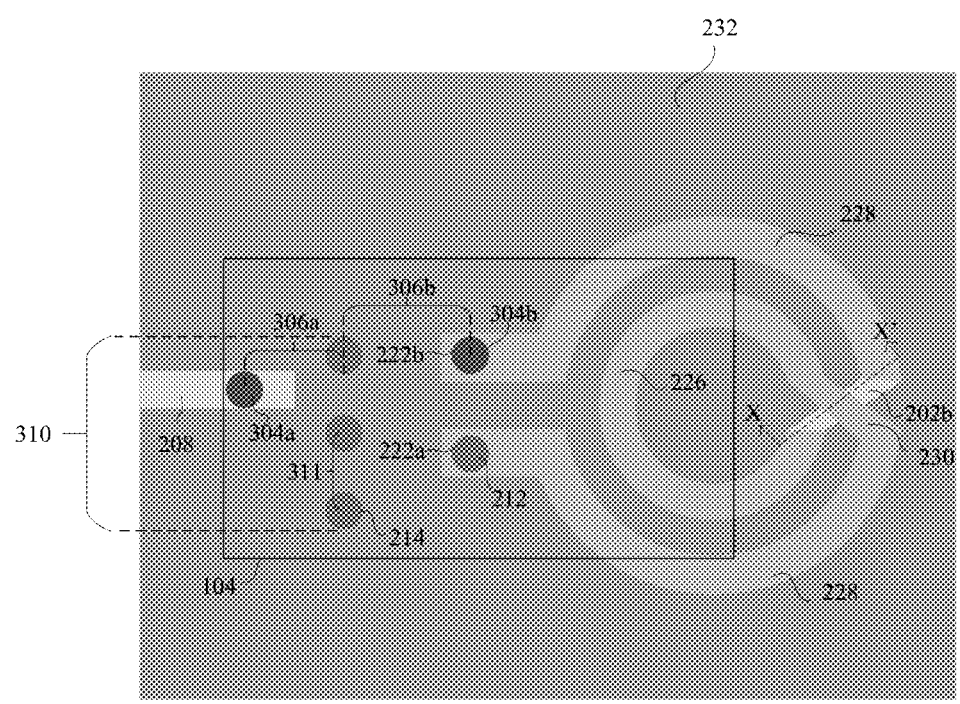

In some embodiments, it is preferable to have the input and output contacts of the TIA chip to be located at the periphery of the TIA chip, as shown in FIG. 3A and FIG. 3C-3E. In another embodiment, either the input contact or the output contact of the TIA chip is located at the periphery of the TIA chip, as shown in FIG. 3B. In an alternative embodiment (not shown), neither the input contacts nor the output contacts are located at the periphery of the TIA chip.

Figure 3C:
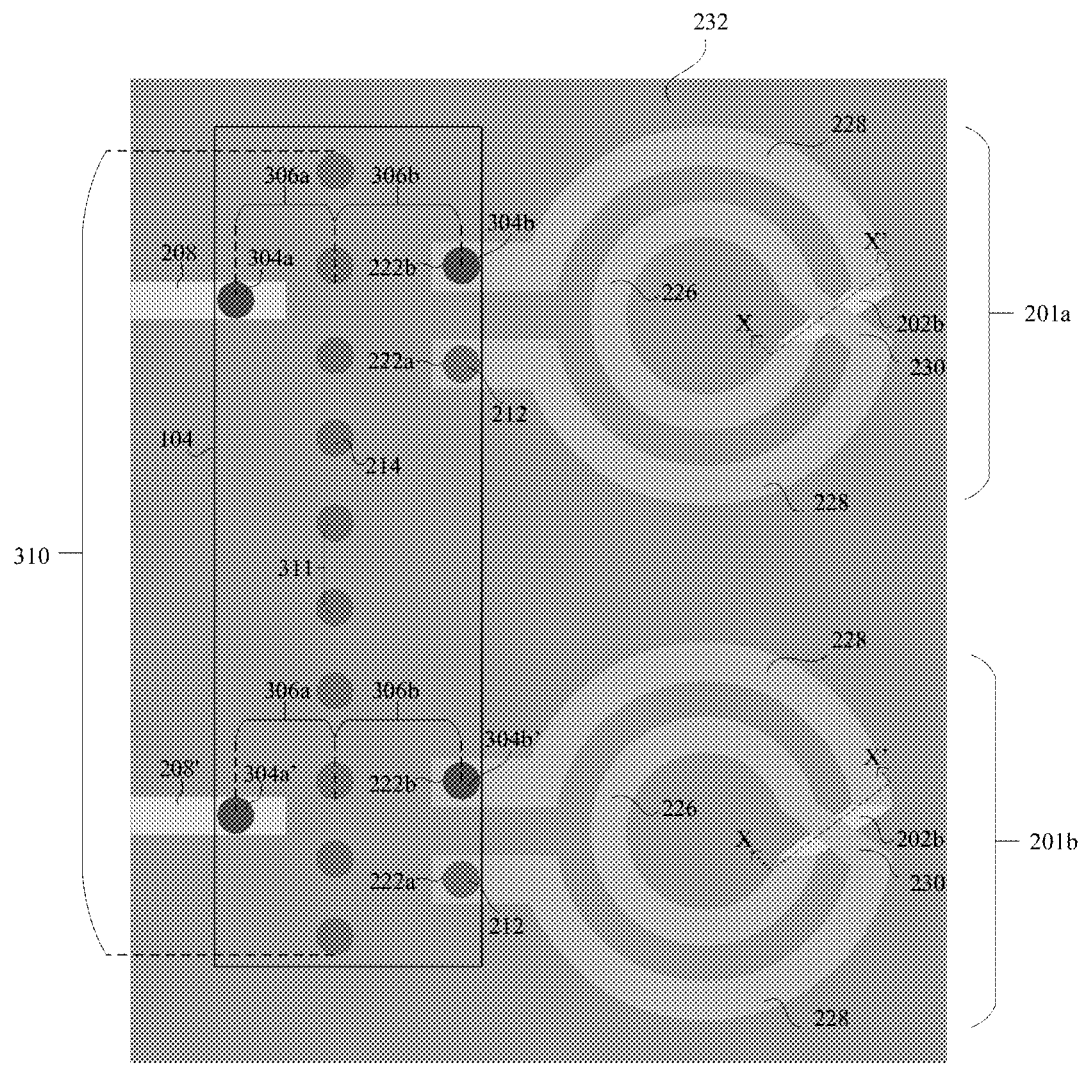
Figure 3D:
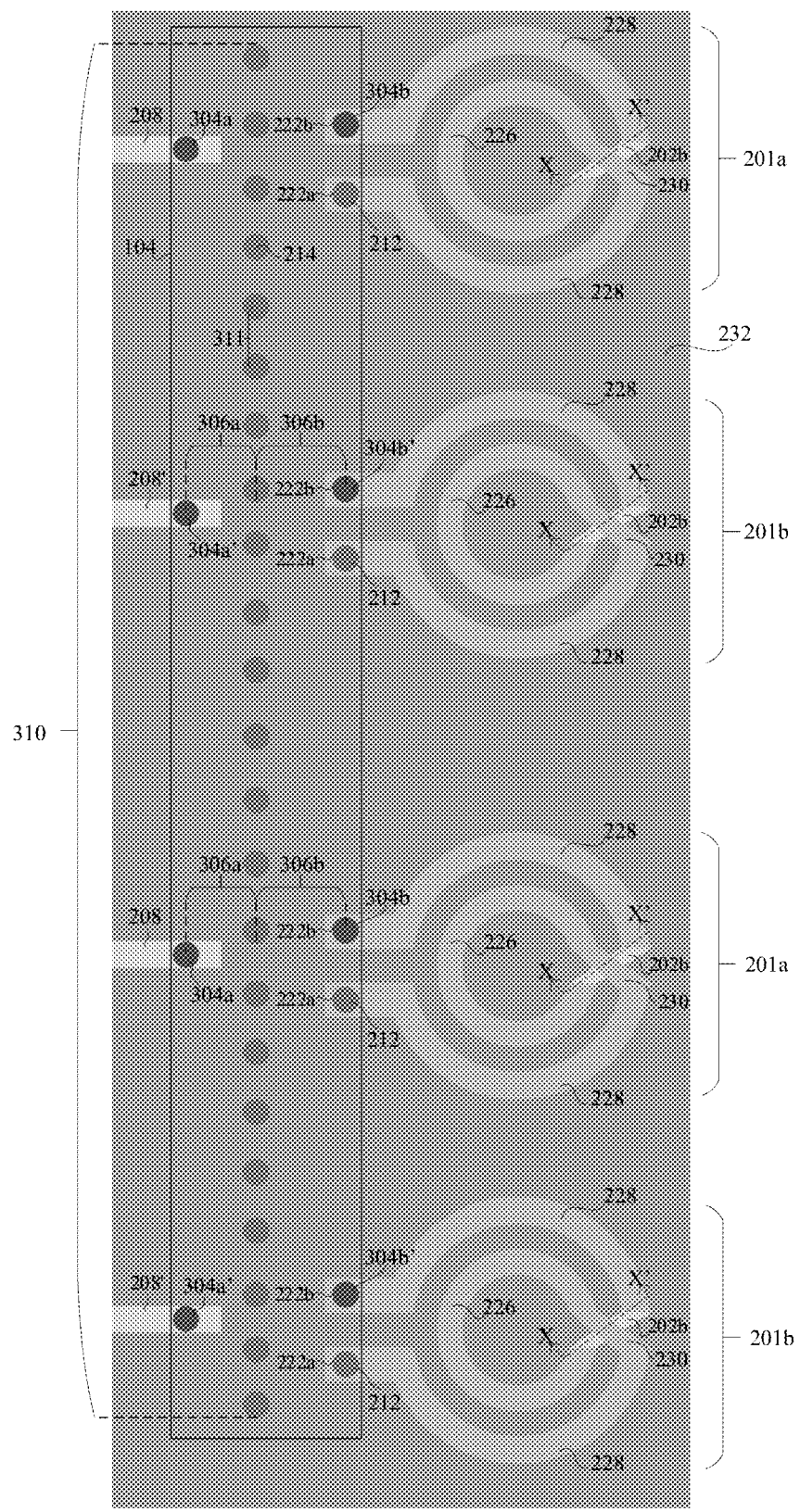
Figure 3E:
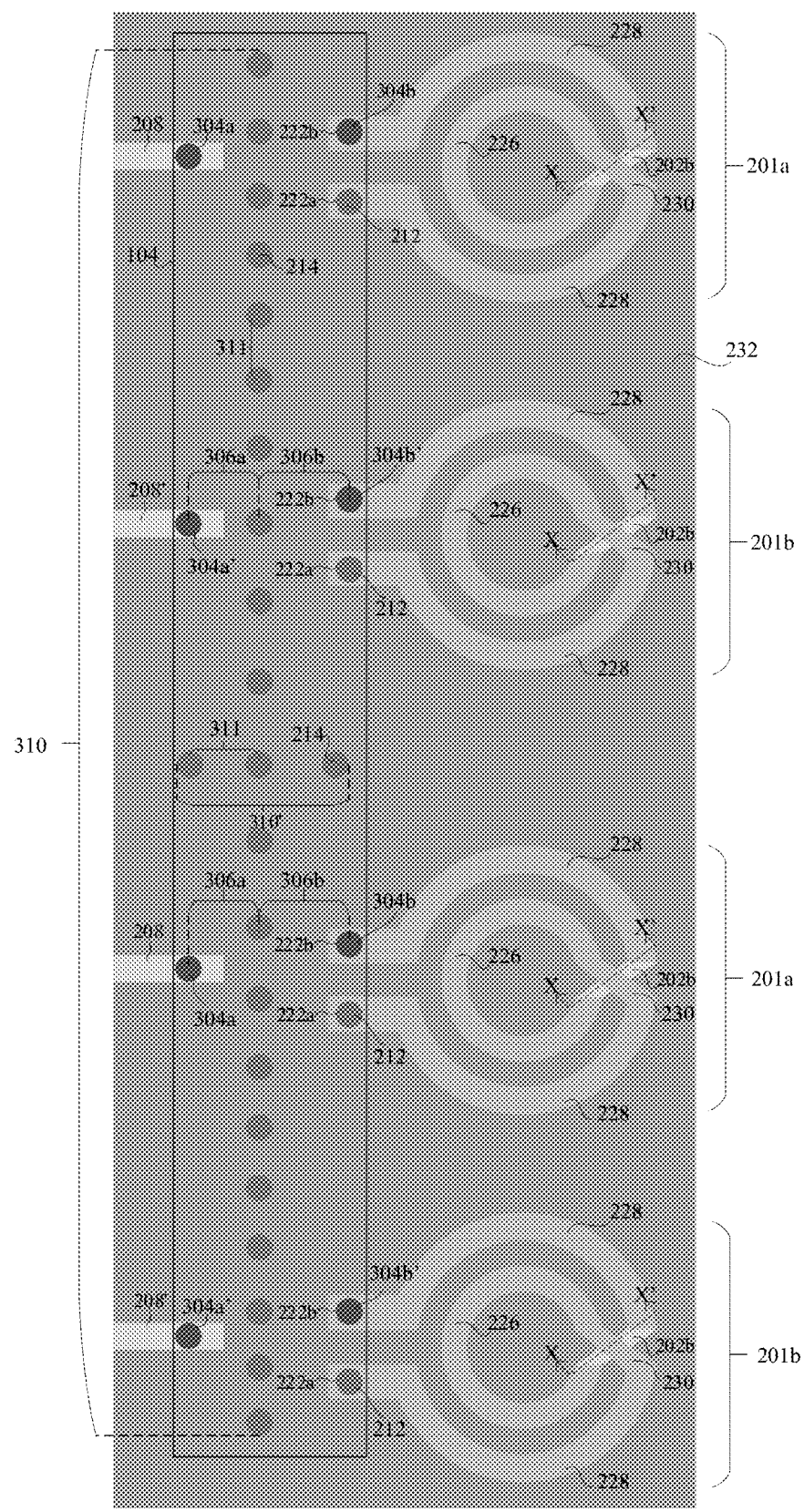

In one embodiment, the TIA chip 104 includes a pair of output contacts 304*a* and 304*a'* positioned at an output side and a pair of input contacts 304*b* and 304*b'* positioned at an input side, as shown in FIG. 3C. In other embodiments, the TIA chip 104 includes one or more pairs of output contacts 304*a* and 304*a'* positioned at an output side and one or more pairs of input contacts 304*b* and 304*b'* positioned at an input side, as shown in FIGS. 3D-3E. Each output contact 304*a* and 304*a'* is electrically connected to an individual conductive trace 208 and 208' in the multilayer dielectric body 232 by conductive bumps and conductive pillars. Conductive wires may bridge one or more conductive traces 208 and 208' to the laminate substrate as described herein.

In one embodiment, a pair of inductors 201*a* and 201*b* is connected to the pair of input contacts 304*b* and 304*b'* of the TIA chip, as shown in FIG. 3C. In other embodiments, one or more pairs of inductors 201*a* and 201*b* are connected to the pairs of input contacts 304*b* and 304*b'* of the TIA chip, as shown in FIG. 3D-3E. As described herein, the second terminal ends 222*b* of the inductors 201*a* and 201*b* are electrically connected to the input contacts 304*b* of the TIA chip by conductive bumps and conductive pillars. Each pair of inductors may include a positive signal inductor 201*a* and a negative signal inductor 201*b*. The positive inductor 201*a* may be arranged on the adjacent side of the negative inductor 201*b*.

In one embodiment, each inductor body is preferentially uncovered by the TIA chip, as shown in FIG. 3A and FIG. 3C-3E. In an alternative embodiment, at least half of the inductor body is covered by the TIA chip, as shown in FIG. 3B.

A plurality of ground vias 214 is formed in the multilayer dielectric body 106, as shown in FIGS. 3A-3E. The TIA chip 104 is positioned over the plurality of ground vias 214. In one embodiment, the TIA chip 104 includes one or more ground contacts being positioned over the plurality of ground vias 214 and connected thereto.

The plurality of ground vias 214 may be aligned with one another in a single file so as to form a via fence 310. Each ground via 214 of the via fence 310 is spaced apart from one another by a predetermined spacing 311. The via fence 310 is also spaced apart from and positioned between the input contact and the output contact of the TIA chip. In one embodiment, the via fence 310 is positioned between the input and output contacts by a predetermined spacing 306*a* and 306*b*. Advantageously, the via fence functions as an isolation to prevent electromagnetic coupling between the electromagnetic waves propagated from the output connection of the TIA chip and the inductor.

In an alternative embodiment shown in FIG. 3E, the plurality of ground vias 214 may include one set of via fence 310 and another set of via fence 310'. Each ground via 214 of the another set of via fence 310' is also spaced apart from one another by the predetermined spacing 311. The another set of via fence 310' is spaced apart from and positioned between each pair of between each pair of TIA chip input contacts 304*b* and 304*b'* and each pair of TIA chip output contacts 304*a* and 304*a'*, as shown in FIG. 3E. In the alternative embodiment, both the one and another via fences (310 and 310' respectively) function as isolations to prevent electromagnetic coupling of electromagnetic waves as described above.

The spacing 311 between each ground via and the spacing 306*a* and 306*b* of the via fence between the input and output contacts of the TIA chip may be designed based on the desired frequency of the semiconductor device operation. For example, for a 32 GHz operation, the spacing 311 between each ground via is determined to be less than a tenth of the wavelength of the insulating layers in the multilayer dielectric body 232 and the spacing 306*a* and 306*b* of the via fence between the input and output contact of the TIA chip is determined to be a quarter of the wavelength of the insulating layers. The wavelength of the insulating layers can be determined based on the dielectric constant of the material in the insulating layers. In one embodiment, the spacing 311 between each ground via is preferably less than 0.5 mm, and the spacing 306a and 306b of the via fence between the input and output contact of the TIA chip is preferably about 1.25 mm.

Referring to FIGS. 3A-3E, the second terminal end 222b joins the outer turn 228 of the inductor turning layer. The outer turn 228 is interconnected to the inner turn 226 of the inductor turning layer by the crossing layer 202b. The inner turn 226 is coupled to the outer turn 228 by a coupling line 230, and then connected to a first terminal end 222a of the inductor. The first terminal end 222a of the inductor interconnects the PIC chip by the inductor via 212. In one embodiment, the first terminal end 222a and the second terminal end 222b of the inductor is positioned between the PIC chip and the TIA chip. In another embodiment, the input side of the TIA chip is positioned over the first terminal end 222a and the second terminal end 222b of the inductor.

As shown in FIGS. 3A-3E, the inner turn 226 and the outer turn 228 are concentric with each other. The dimensions of the inner turn 226 and the outer turn 228 may be designed based on the predetermined inductance value for a desired bandwidth. For example, to obtain an inductance value of about 0.52 nH, the inner concentric turn 226 is designed to be spaced apart from the outer concentric turn 228 by about 20 µm. Additionally, the inner turn 226 and the outer turn 228 each has width of about 20 µm. In one embodiment, the outer turn 228 has a preferred diameter of about 200 µm.

Figure 4:
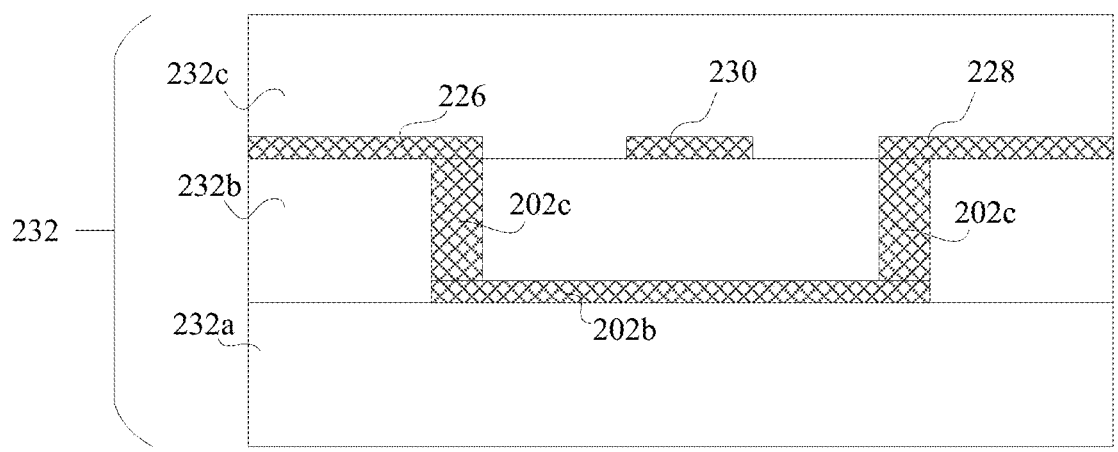
FIG. 4 shows a cross section of the inductor in accordance with embodiments of the present disclosure corresponding to the section line X-X' shown in FIGS. 3A-3E.

FIG. 4 is a cross-sectional view of the crossing layer 202b along a line corresponding to the section line X-X' in FIGS. 3A-3E. As shown in FIG. 4, the crossing layer 202b interconnects the inner turn 226 and the outer turn 228 by inductor interconnect vias 202c. The crossing layer 202b is positioned in a different insulating layer from the inner turn 226 and the outer turn 228 of the turning layer. In another embodiment, the crossing layer 202b is also substantially parallel to the inner turn 226 and the outer turn 228 of the turning layer.

Figure 5:
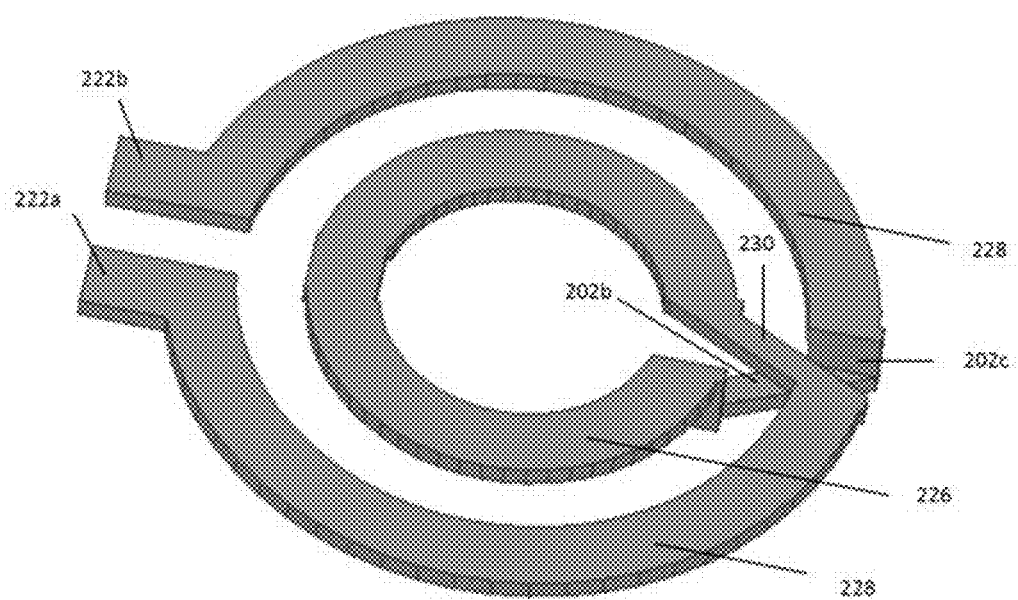
FIG. 5 shows a perspective view of an inductor in accordance with embodiments of the present disclosure. The insulating layers which the inductor is embedded in are not shown for clarity's sake.

A perspective view of the inductor in accordance with embodiments of the present disclosure is shown in FIG. 5. The insulating layers which the inductor is embedded in are not shown so as not to obscure the inductor elements shown in FIG. 5.

As used herein, the term "deposition" generally refers to the process of applying a material over another material (or the substrate). CVD and atomic layer deposition (ALD) are some of the common techniques for depositing materials. Other "deposition" techniques, may include "spin-on" or "spin-coating", which generally involves providing a stream of material to the substrate, while the substrate is spinning, resulting in a relatively thin, flat, evenly-distributed coating of the material on the underlying substrate.

Throughout this disclosure, the terms top, upper, upwards, over, and above refer to the direction away from the PIC chip. Likewise, the terms bottom, lower, downwards, under, and below refer to the direction towards the PIC chip.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many conventional processes are only mentioned briefly herein or omitted entirely without providing the well-known process details.

As will be readily apparent to those skilled in the art upon a complete reading of the present application, the semiconductor devices and methods disclosed herein may be employed in manufacturing a variety of different integrated circuit products and packaging modules, including, but not limited to, photonics modules, optical communication systems, etc.

What is claimed is:

1. A semiconductor device comprising:
   a photonic integrated circuit (PIC) chip;
   an inductor positioned over the PIC chip, the inductor having first and second terminal ends, wherein the first terminal end is connected to the PIC chip; and
   a transimpedance amplifier (TIA) chip positioned over the PIC chip and the inductor, the TIA chip having an input contact and an output contact, wherein the inductor is between the TIA chip and the PIC chip, the inductor comprising a body that extends beyond and is at least partially uncovered by the TIA chip, and wherein the input contact of the TIA chip is connected to the second terminal end of the inductor and the output contact of the TIA chip being distal from the inductor.

2. The device of claim 1, wherein an input side of the TIA chip is positioned over the first and second terminal ends of the inductor.

3. The device of claim 2, wherein the inductor is positioned within a multilayer dielectric body on the PIC chip, the multilayer dielectric body comprising a plurality of insulating layers.

4. The device of claim 3, wherein the inductor comprises a body having a turning layer and a crossing layer, wherein the turning layer and the crossing layer are positioned in different insulating layers of the multilayer dielectric body.

5. The device of claim 3, further comprising:
   a plurality of ground vias positioned within the multilayer dielectric body and connected to the PIC chip, wherein the ground vias are spaced apart from one another and aligned in a fence-like structure.

6. The device of claim 5, wherein the TIA chip is positioned over the plurality of ground vias and the plurality of ground vias are spaced apart from and positioned between the input and output contacts of the TIA chip.

7. The device of claim 6, wherein the TIA chip further comprises one or more ground contacts positioned over the plurality of ground vias and connected thereto.

8. The device of claim 7, wherein the input and output contacts are located at a periphery of the TIA chip.

9. The device of claim 3, wherein the output contact of the TIA chip is connected to a conductive trace positioned within the multilayer dielectric body.

10. The device of claim 9, further comprising:
    a laminate substrate having a cavity, wherein the PIC chip is placed within the cavity of the laminate substrate; and
    a conductive wire bridging the conductive trace to the laminate substrate.

11. A method of forming a semiconductor device comprising:
  providing a PIC chip;
  forming an inductor over the PIC chip, the inductor having a body and first and second terminal ends, and the first terminal end is connected to the PIC chip;
  providing a TIA chip having an input contact and an output contact; and
  positioning the TIA chip to have the input contact over and connecting with the second terminal end of the inductor, and to have the output contact of the TIA chip distal from the inductor, wherein the inductor being positioned between the TIA chip and the PIC chip and the body of the inductor being extended beyond and at least partially uncovered by the TIA chip.

12. The method of claim 11, wherein forming the inductor over the PIC chip includes forming the inductor in a multilayer dielectric body on the PIC chip.

13. The method of claim 12, wherein forming the inductor includes forming redistribution patterns in the multilayer dielectric body.

14. The method of claim 13, wherein forming redistribution patterns in the multilayer dielectric body comprises forming a plurality of ground vias in the multilayer dielectric body, the plurality of ground vias is spaced apart from and positioned between the input and output contacts of the TIA chip, wherein the ground vias are spaced apart from one another and aligned in a fence-like structure.

15. The method of claim 14, wherein positioning the TIA chip includes connecting the plurality of ground vias with ground contacts of the TIA chip.

16. The method of claim 15, further comprising:
  providing a laminate substrate having a cavity;
  positioning the PIC chip within the cavity of the laminate substrate; and
  bridging the laminate substrate to a conductive trace formed in the multilayer dielectric body.

17. A semiconductor device comprising:
  a photonic integrated circuit (PIC) chip;
  an inductor positioned over the PIC chip, the inductor having first and second terminal ends, wherein the first terminal end is connected to the PIC chip; and
  a transimpedance amplifier (TIA) chip positioned over the PIC chip and the inductor, the TIA chip having an input contact and an output contact, wherein the inductor is between the TIA chip and the PIC chip, the inductor comprising a body having a turning layer and a crossing layer, and wherein the input contact of the TIA chip is connected to the second terminal end of the inductor and the output contact of the TIA chip being distal from the inductor.

18. The device of claim 17, wherein the inductor is positioned within a multilayer dielectric body on the PIC chip, the multilayer dielectric body comprising a plurality of insulating layers, wherein the turning layer and the crossing layer are positioned in different insulating layers of the multilayer dielectric body.

19. The device of claim 17, wherein the body of the inductor extends beyond and is at least partially uncovered by the TIA chip.

* * * * *